United States Patent
Singh et al.

(10) Patent No.: US 9,287,093 B2
(45) Date of Patent: Mar. 15, 2016

(54) DYNAMIC ION RADICAL SIEVE AND ION RADICAL APERTURE FOR AN INDUCTIVELY COUPLED PLASMA (ICP) REACTOR

(75) Inventors: Saravjeet Singh, Santa Clara, CA (US); Graeme Jamieson Scott, Sunnyvale, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 818 days.

(21) Appl. No.: 13/455,342

(22) Filed: Apr. 25, 2012

(65) Prior Publication Data

US 2012/0305184 A1 Dec. 6, 2012

Related U.S. Application Data

(60) Provisional application No. 61/491,679, filed on May 31, 2011.

(51) Int. Cl.
   *C23C 16/00* (2006.01)
   *H01L 21/306* (2006.01)
   *H01J 37/32* (2006.01)

(52) U.S. Cl.
   CPC ......... *H01J 37/321* (2013.01); *H01J 37/32623* (2013.01); *H01J 37/32633* (2013.01)

(58) Field of Classification Search
   CPC .................. H01J 37/32623; H01J 37/32633; H01J 37/32642; H01J 37/32651; H01J 37/321; H01J 37/3211; H01J 37/32119; H01J 37/32128; H01J 37/32137; H01J 37/32146; H01J 37/32155; H01J 37/32165; H01J 37/32174; H01J 37/32183

USPC ......... 156/345.3, 345.48, 345.49; 118/723 R, 118/723 I, 723 IR, 723 AN
See application file for complete search history.

(56) References Cited

U.S. PATENT DOCUMENTS 5,779,803 A * 7/1998 Kurono et al. ............ 118/723 R
7,943,005 B2 5/2011 Kumar et al.
(Continued)

FOREIGN PATENT DOCUMENTS

| KR | 10-2000-0030996 | 6/2000 |
| KR | 10-2007-0003172 | 6/2007 |
| WO | WO-2011-062162 A1 | 5/2011 |

OTHER PUBLICATIONS

International Search Report and Written Opinion for Application No. PCT/2012/034915 dated Nov. 30, 2012.

*Primary Examiner* — Luz Alejandro Mulero
(74) *Attorney, Agent, or Firm* — Patterson & Sheridan, LLP

(57) ABSTRACT

Embodiments described herein provide apparatus and methods of etching a substrate using an ion etch chamber having a movable aperture. The ion etch chamber has a chamber body enclosing a processing region, a substrate support disposed in the processing region and having a substrate receiving surface, a plasma source disposed at a wall of the chamber body facing the substrate receiving surface, an ion-radical shield disposed between the plasma source and the substrate receiving surface, and a movable aperture member between the ion-radical shield and the substrate receiving surface. The movable aperture member is actuated by a lift assembly comprising a lift ring and lift supports from the lift ring to the aperture member. The ion-radical shield is supported by shield supports disposed through the aperture member. The aperture size, shape, and/or central axis location may be changed using inserts.

16 Claims, 5 Drawing Sheets

(56) References Cited

U.S. PATENT DOCUMENTS

| | | |
|---|---|---|
| 2005/0263484 A1 | 12/2005 | Park et al. |
| 2006/0000802 A1 | 1/2006 | Kumar et al. |
| 2006/0000805 A1 | 1/2006 | Todorow et al. |
| 2008/0099431 A1* | 5/2008 | Kumar et al. .................. 216/44 |
| 2009/0239364 A1* | 9/2009 | Nishita et al. ................ 438/585 |
| 2012/0228261 A1 | 9/2012 | Watanabe et al. |

* cited by examiner

DYNAMIC ION RADICAL SIEVE AND ION RADICAL APERTURE FOR AN INDUCTIVELY COUPLED PLASMA (ICP) REACTOR

CROSS-REFERENCE TO RELATED APPLICATION

This application claims benefit of U.S. Provisional Application Ser. No. 61/491,679, filed May 31, 2011, which is incorporated herein by reference.

FIELD

Embodiments described herein relate to semiconductor manufacturing methods and apparatus. More specifically, substrate etching methods and apparatus are disclosed.

BACKGROUND

Pattern etching is a staple of semiconductor manufacturing. A substrate is commonly exposed to a plasma of reactive ions and neutrals to etch a pattern into a surface of the substrate. Such processes are typically used to etch a pattern into a substrate that is subsequently used in photolithographic patterning of semiconductor substrates. The substrate is usually glass or quartz, with a layer of chromium and/or molybdenum-doped silicon nitride on one side. The layer is covered with an anti-reflective coating and a photosensitive resist, and patterned by exposure to patterned UV light. Exposed portions of the resist are dissolved, and the underlying chromium layer is patterned by plasma etching.

During plasma etching, a plasma is generally formed adjacent the substrate. Reactive ions and radicals from the plasma react with the substrate surface, removing material from the surface. The rate of material removal, or etching, at a location on the substrate surface is proportional to the density of reactive species adjacent to that location. Due to microloading, variation in aspect ratio, plasma effects, and chamber effects, uniformity of the density of reactive species across the surface of a substrate often varies, resulting in variation of etch rate across the substrate. In many cases, etch rate is observed to be higher near the center of a substrate and lower near the periphery.

Prior methods of addressing etch rate uniformity include chemical methods of etch rate control, thermal methods of controlling precursor temperature and thermal profile of the plasma, and electromagnetic methods featuring electrodes placed at different locations within the chamber. There remains, however, a need for methods and apparatus that influence the density profile of a plasma in a dynamic, adjustable way.

SUMMARY

Embodiments described herein provide apparatus and methods of etching a substrate using an ion etch chamber having a movable aperture. The ion etch chamber has a chamber body enclosing a processing region, a substrate support disposed in the processing region and having a substrate receiving surface, a plasma source disposed at a wall of the chamber body facing the substrate receiving surface, an ion-radical shield disposed between the plasma source and the substrate receiving surface, and a movable aperture member between the ion-radical shield and the substrate receiving surface. The movable aperture member is actuated by a lift assembly comprising a lift ring and lift supports from the lift ring to the aperture member. The ion-radical shield is supported by shield supports disposed through the aperture member. The aperture size, shape, and/or central axis location may be changed using inserts.

The lift ring may be actuated by a linear actuator to move the aperture member closer to or further from a substrate disposed on the substrate support. A method described herein of processing a substrate includes disposing an aperture member between an ion-radical shield and a substrate receiving surface of an ion etching chamber and controlling a density profile of reactive species near the substrate receiving surface by moving the aperture member closer to or further from the substrate receiving surface.

In another embodiment, the lift ring may be coupled to the ion-radical shield to move the ion-radical shield closer to or further from the aperture member, while the aperture member is supported from a fixed member.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
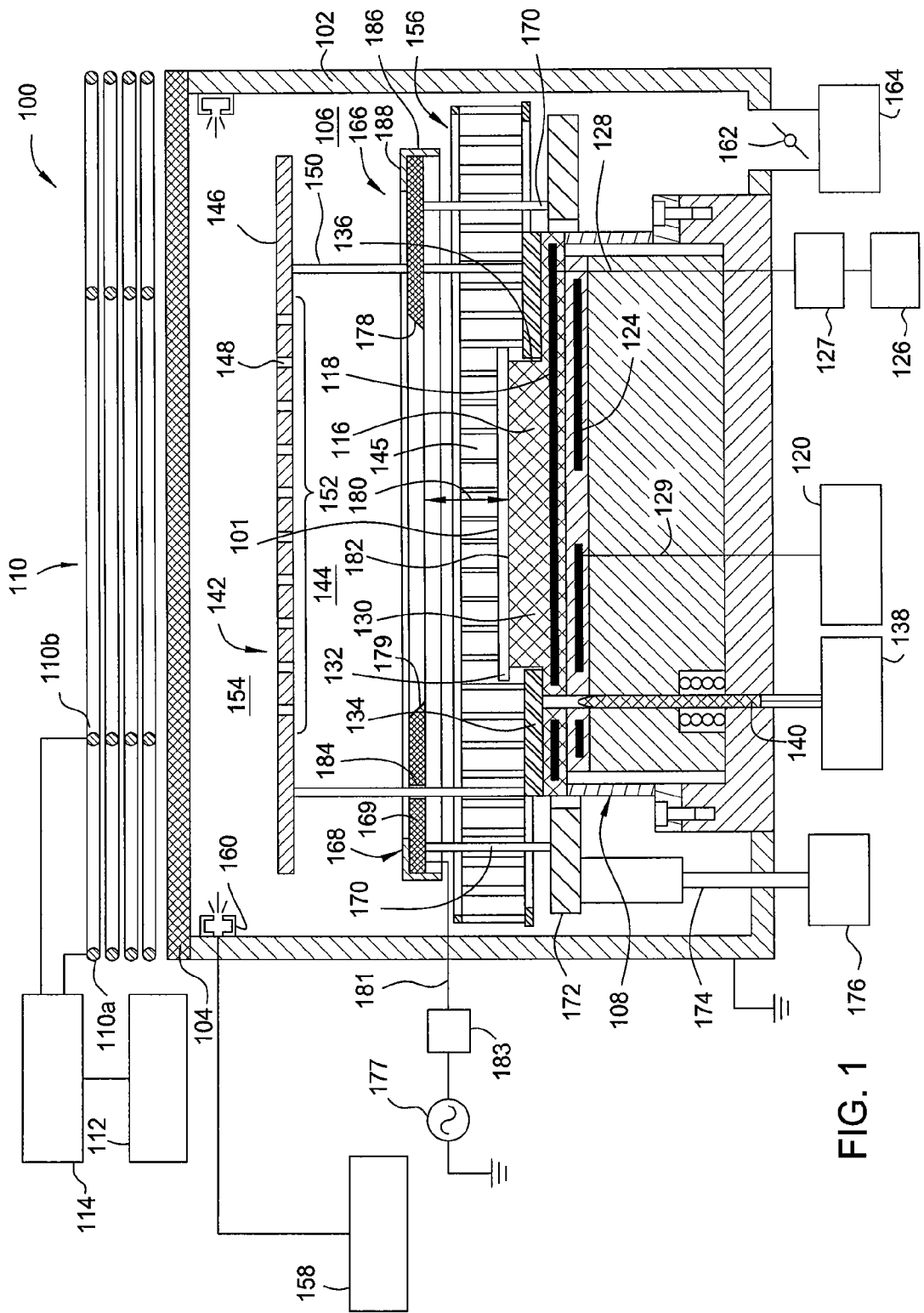
FIG. 1 is a schematic sectional side view of a processing chamber according to one embodiment.

Embodiments described herein provide a method and apparatus for etching a substrate using a movable aperture member. FIG. 1 is a schematic sectional side view of a processing chamber 100 according to one embodiment. Suitable processing chambers that may be adapted for use with the teachings disclosed herein include, for example, the Decoupled Plasma Source (DPS®) II reactor, or the Tetra™ family of substrate etch systems, all of which are available from Applied Materials, Inc. of Santa Clara, Calif. The particular embodiment of the processing chamber 100 shown herein is provided for illustrative purposes and should not be used to limit the scope of the invention. It is contemplated that the invention may be utilized in other plasma processing chambers, including those from other manufacturers.

The processing chamber 100 generally includes a processing volume 106 defined by chamber walls 102 and a chamber lid 104. The processing chamber 100 includes a plasma source 122 for supplying or generating a plasma in the processing volume 106. The plasma source 122 may include an antenna 110 disposed above the chamber lid 104 for generating an inductively coupled plasma in the processing volume 106. The antenna 110 may include one or more co-axial coils 110a, 110b. The antenna 110 may be coupled to a plasma power source 112 via a matching network 114.

A supporting assembly 108 is disposed within the processing volume 106 for supporting the substrate 101 being processed on a raised portion 130. The raised portion 130 may function as a stage for positioning the substrate 101 at a desired location within the processing volume 106. A top surface 182 of the raised portion 130 functions as a substrate receiving surface. The supporting assembly 108 may include an electrostatic chuck 116, which has at least one clamping electrode 118 connected to a chuck power supply 126 by an electrical connection 128. The supporting assembly 108 may include other substrate retention mechanisms such as a susceptor clamp ring, a mechanical chuck, a vacuum chuck, and the like. The supporting assembly 108 may include a resistive heater 124 coupled to a heater power supply 120 and a heat sink 129 for temperature control.

The chuck power supply 126 may be an RF generator in some embodiments, so an impedance match circuit 127 may be interposed between the chuck power supply 126 and the clamping electrode 118. The bias power from the chuck power supply 126 or the source power from the plasma power source 112, or both, may be pulsed or continuous. The chuck power supply 126 and/or the plasma power source 112 may be operable to provide pulsed RF power at a frequency between about 1 kHz and about 10 kHz, a duty cycle between about 10% and about 90%, with a minimum pulse duration of about 10 μsec. The match circuit 114 and/or the match circuit 127 may be operable to provide a stable plasma at load of about 50Ω.

The supporting assembly 108 also includes an adaptor 134 for transferring the substrate 101 between the raised portion 130 and an exterior transfer device, such as an exterior robot. The adaptor 134 is disposed over the electrostatic chuck 116 and may have an opening 136 allowing the raised portion 130 to extend therethrough. The adaptor 134 may be lifted from the electrostatic chuck 116 by a plurality of lift pins 140 coupled to a lift mechanism 138. Exemplary adaptors are described in U.S. Pat. No. 7,128,806, entitled "Mask Etch Processing Apparatus".

The processing chamber 100 may also include an ion-radical shield 142 disposed above the supporting assembly 108. The ion-radical shield 142 may be electrically isolated from the chamber walls 102 and the supporting assembly 108. The ion-radical shield 142 includes a substantially flat plate 146 having a plurality of through holes 148 and a plurality of shield supports 150 supporting the flat plate 146 and positioning the flat plate 146 at a certain distance above the supporting assembly 108. The plurality of shield supports 150 may be disposed on the electrostatic chuck 116, the adaptor 134 or a baffle 156. The plurality of through holes 148 may be confined to an open area 152 of the flat plate 146. The open area 152 controls the amount of ions that pass from a plasma formed in an upper volume 154 of the processing volume 106 to a lower volume 144 located between the ion-radical shield 142 and the supporting assembly 108. The areal extent covered by the through holes 148 may be larger than an areal extent of the top surface 182. Exemplary ion-radical shields may be found in U.S. Pat. No. 7,909,961, entitled "Method and Apparatus for Substrate Plasma Etching".

A gas panel 158 is connected to inlets 160 for supplying one or more processing gases towards the processing volume 106. A vacuum pump 164 is coupled to the processing volume 106 via a throttle valve 162. The baffle 156 may be disposed around the supporting assembly 108 upstream to the throttle valve 162 to enable even flow distribution and compensate for conductance asymmetries in the processing volume 106.

An aperture assembly 166 includes an aperture member 168 supported between the ion-radical shield 142 and the supporting assembly 108 on a plurality of lift supports 170, which may be support pins, coupled to a lift ring 172. The aperture member 168 separates the lower volume 144 from a processing zone 145 between the aperture member and the top surface 182 of the raised portion 130. An actuator 176, such as a linear actuator, for example a hydraulic cylinder, pneumatic cylinder or electrically driven screw actuator, coupled to the lift ring 172 through a shaft 174, moves the aperture member 168 closer to, or further from, the supporting assembly 108. Moving the aperture member 168 adjusts the distribution of reactive species near a substrate on the supporting assembly 108.

An edge shield 188 may be coupled to the aperture member 168. The edge shield 188 is generally an annular member that has an extension toward the supporting assembly 108 beyond the aperture member 168. The extension of the edge shield 188 prevents process gases flowing around the aperture member 168 to the supporting assembly 108 and any substrate disposed thereon.

The aperture member 168 has an aperture 178 formed in a central region of the aperture member 168 through which process gases flow to contact the substrate 101. The aperture is shown in FIG. 1 as having a dimension larger than a corresponding dimension of the substrate 101, but the dimension of the aperture may be smaller than, or about the same size as, the corresponding dimension of the substrate 101 in some embodiments. The dimension of the aperture and its proximity to the substrate influence the distribution of reactive species across the substrate surface. In some embodiments, the aperture member 168 may be a focus plate that focuses reactive species to a desired distribution at the top surface 182 of the raised portion 130.

The lift ring 172 is disposed in the processing volume 106 radially outwards of the supporting assembly 108. The lift ring 172 is mounted on the shaft 174 in a substantially horizontal orientation. The shaft 174 is driven by the actuator 176 to move the lift ring 172 vertically in the processing volume 106. The three or more lift supports 170 are extending upward from the lift ring 172 and positioning the aperture member 168 above the supporting assembly 108. The three or more lift supports 170 fixedly attach the aperture member 168 to the lift ring 172. The aperture member 168 moves vertically with the lift ring 172 in the processing volume 106 so that the aperture member 168 can be positioned at a desired distance above the substrate 101 and/or an exterior substrate handling device can enter the processing volume 106 between the aperture member 168 and the supporting assembly 108 to transfer the substrate 101.

The three or more lift supports 170 may be positioned to allow the substrate 101 to be transferred in and out the processing chamber 100. In one embodiment, each of the three or more lift supports 170 may be positioned close to one of the plurality of shield supports 150 supporting the ion-radical shield to maximize access to the substrate 101.

The aperture member 168 may be a planar plate in a size substantially similar to the inner dimension of the chamber wall 102 so that the aperture member 168 can block the downward flow of the processing gas or plasma in the processing volume 106. In one embodiment, the chamber wall 102 is cylindrical and the aperture member 168 may be a disk having an outer diameter slightly smaller than an inner diameter of the chamber wall 102. The aperture 178 is aligned with the raised portion 130 of the electrostatic chuck 116, and may be positioned substantially parallel to the substrate 101. The aperture 178 provides a restricted path for the processing gas, or active species, to flow downwards toward the raised portion 130 where the substrate 101 is positioned, thus, controlling the plasma-exposure of the substrate 101.

The aperture 178 of the aperture member 168 has an edge 179 that may be contoured for supporting a second member, such as an insert, as described in more detail in connection with FIG. 5B. The cross-sectional shape of the contour may be one of beveled, curved, or stepped. The contour of the edge 179 faces the ion-radical shield 142, such that a second member may be supported in the aperture 178 in substantially parallel relationship with the aperture member 168. In an embodiment wherein the edge 179 has a bevel, the bevel may be a straight bevel machined at any angle up to about 75° referenced to the plane of the aperture member 168. In other embodiments, the bevel may be curved or faceted, if desired. The edge 179 may be partially beveled in some embodiments, with a beveled portion and a straight portion. For example, a first portion of the edge 179 proximate a surface of the aperture member 168 facing the ion-radical shield 142 may be beveled while a second portion of the edge 179 proximate a surface of the aperture member 168 facing the top surface 182 of the raised portion 130 may be straight (i.e. substantially perpendicular to the top surface 182). Such a partially beveled edge may improve stability of a sizing insert nested with the aperture member 168.

The aperture 178 may be shaped substantially similar to the shape of the substrate 101 being processed. The aperture 178 may be slightly larger than a top surface of the substrate 101 to provide a suitable process window for affecting distribution of reactive species across the surface of the substrate 101. For example, the aperture 178 may be larger than about 6×6 inches. A distance 180 between the aperture member 168 and the top surface 182 of the raised portion 130 can be adjusted to achieve desired plasma-exposure of the substrate 101.

By operating the lift ring 172, the aperture member 168 may be movably positioned below the ion-radical shield 142 and above the supporting assembly 108. The aperture member 168 may have a plurality of openings 184 to accommodate the plurality of shield supports 150 that support the flat plate 146 of the ion-radical shield 142. The openings 184 may be through holes, cutouts, notches, or other types of openings formed to allow the aperture member 168 to move freely without impacting the shield supports 150.

During processing, a plasma is usually formed in the processing volume 106. Species in the plasma, such as radicals and ions, pass through the flat plate 146 and the aperture 178 of the aperture member 168 to the substrate 101. The aperture member 168 controls a distribution of the radicals and ions proximate the upper surface of the substrate 101 by creating a flow pathway for the radicals and ions from the lower volume 144 to the processing zone 145. The aperture 178 may be shaped and/or positioned so that species passing through the aperture 178 do not reach the edge and/or sides of the substrate 101. The aperture 178 may also be shaped, sized, and/or positioned to control a density of active species across the substrate 101. In one embodiment, the density of active species near a central region of the substrate 101 may be reduced, and the density near a peripheral region of the substrate increased, by positioning the aperture member 168 closer to the ion-radical shield 142 than to the substrate 101.

The aperture member 168 may be formed from materials that are compatible with the processing chemistry. In one embodiment, the aperture member 168 may be formed from quartz or ceramics, such as alumina, yttria (yttrium oxide), and K140 (a proprietary material available from Kyocera), among others, including combinations and alloys thereof. The aperture member 168 may be coated in some embodiments. A ceramic coated metal material may be useful, for example anodized aluminum or aluminum coated with a deposited or sprayed ceramic coating, such as alumina ($Al_2O_3$) or yttria ($Y_2O_3$).

The aperture member 168 may be electrically isolated from the chamber, or may be electrically energized to provide a bias voltage, if desired, or to remove buildup of voltage from exposure to plasma processing. An electrical connection 181 may be provided with a path to ground, such as the chamber wall 102, to remove voltage buildup. A control element such as a switch, not shown, may be provided. A bias voltage may be applied to the aperture member 168 by coupling a power source to the electrical connection 181. An RF source 177 is shown in FIG. 1, with a filter circuit 183, which may also be or include an impedance match circuit. For biasing the aperture member 168, the electrical connection 181 is generally coupled to a conductive portion of the aperture member 168, such as a metal portion if the aperture member 168 is a ceramic coated metal member.

Figure 2:
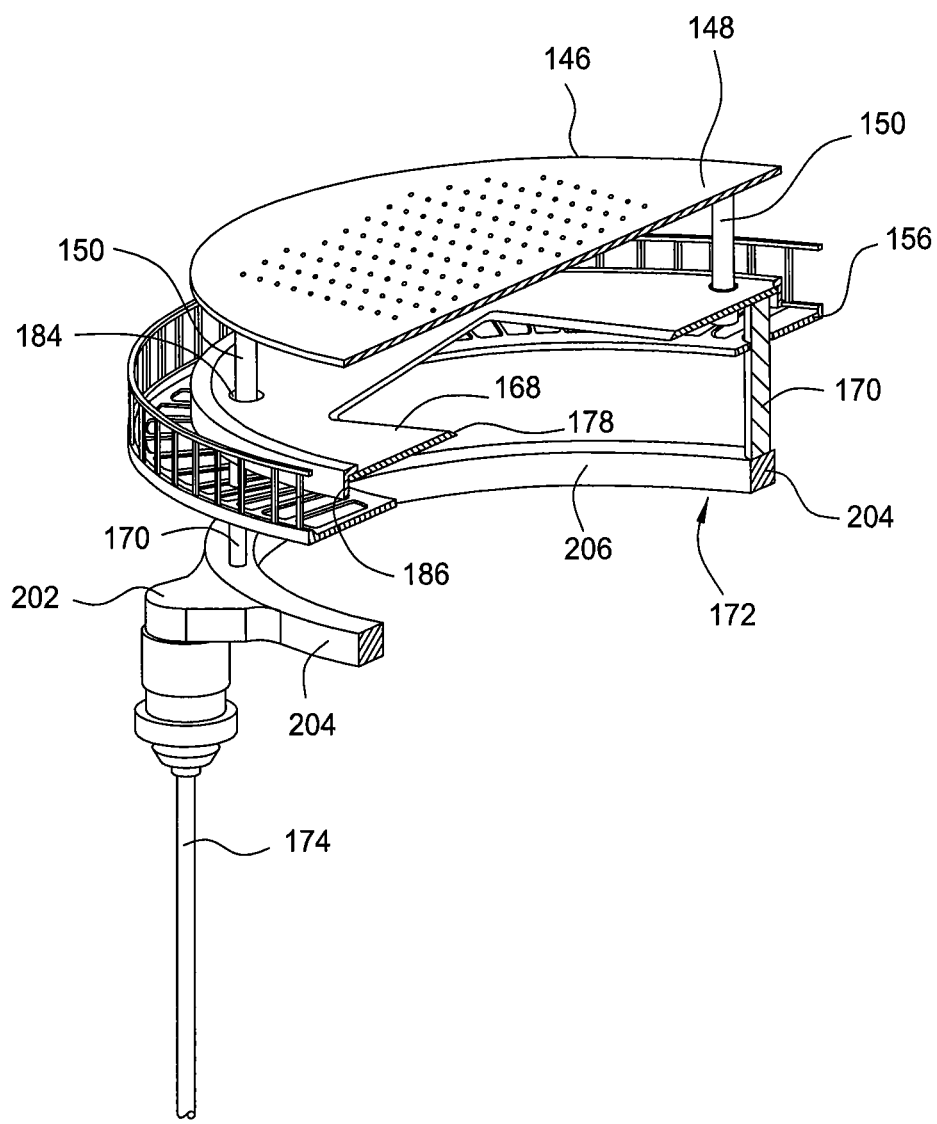
FIG. 2 is a partial perspective view of an aperture assembly according to one embodiment.

FIG. 2 is a partial perspective view of the aperture assembly 266 according to one embodiment, with the chamber lid 104, chamber walls 102 and supporting assembly 108 removed.

The plurality of lift supports 170 penetrate the baffle 156 to position the aperture member 168 between the baffle 156 and the flat plate 146. The plurality of through holes 184 accommodate the shield supports 150 supporting the flat plate 146 on the baffle 156. The staggered arrangement of shield supports 150 and lift supports 170 allows the aperture member 168 to move independently from the baffle 156 and the flat plate 146.

The aperture member 168 is moved vertically by the lift ring 172. The lift ring 172 may include a ring shaped body 204 having a side extension 202. The ring shaped body 204 has an inner opening 206 large enough to surround the supporting assembly 108 (FIG. 1). The side extension 202 is located radially outwards from the ring shaped body 204. The side extension 202 allows the lift loop 172 to connect with an actuator from the side. The side driven arrangement enables the lift ring 172 and the aperture member 168 to have a separate driven mechanism from the baffle 156 and the flat plate 146 of the ion-radical shield 142, thus, improving the process flexibility of the processing chamber 100.

The aperture member 168 may be positioned at different distances above the supporting assembly 108 (FIG. 1) to control distribution of active species across the surface of the substrate 101 and/or enable movements of the substrate 101 and other chamber components.

Figure 3A:
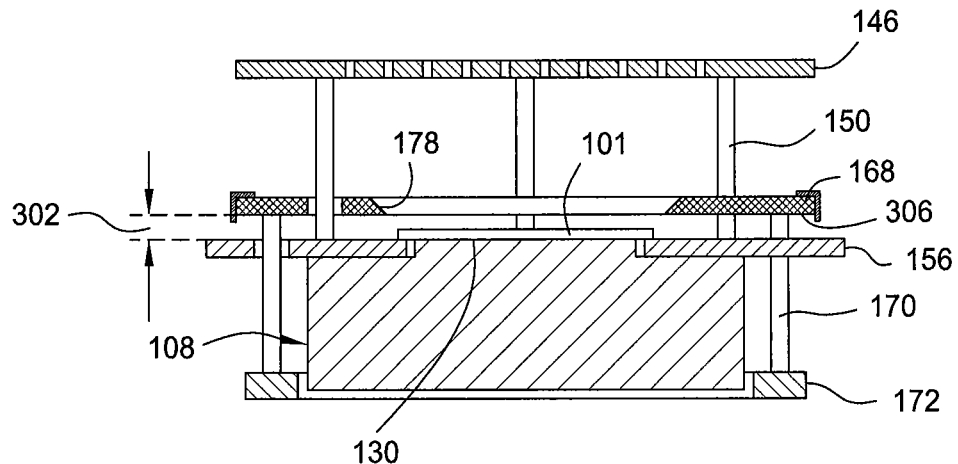
FIGS. 3A-3C are sectional side views showing an aperture assembly in various processing positions.

FIG. 3A is a sectional side view showing the aperture member 168 in a lower processing position. A lower surface 306 is positioned at a distance 302 above the raised portion 130 of the supporting assembly 108. At the lower processing position, the distance 302 is less than about 1.0 inches, such as between about 0.4 inches and about 0.6 inches, for example about 0.42 inches, placing the aperture member 168 close to the substrate 101 being processed. At the lower processing position, the aperture member 168 constrains radicals and ions flowing through the aperture 178 from spreading laterally, resulting in a relatively uniform density of active species across the substrate 101.

Figure 3B:
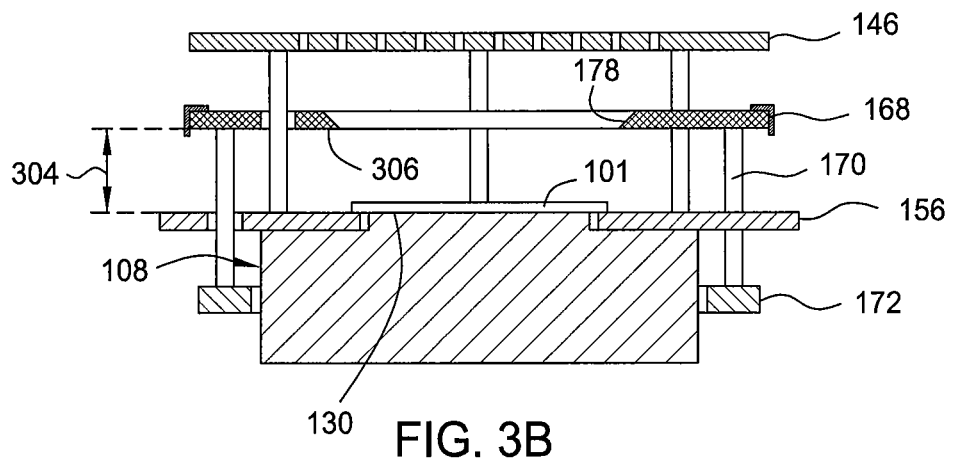

FIG. 3B is a sectional side view showing the aperture member 168 in an upper processing position. The lower surface 306 is positioned at a distance 304 above the raised portion 130 of the supporting assembly 108. At the upper processing position, the aperture member 168 allows radicals and ions flowing through the aperture 178 to spread laterally before contacting the substrate 101. As the radicals and ions spread laterally, density of active species near a peripheral portion of the substrate 101 becomes lower than density of active species near a central portion of the substrate 101. Thus, adjusting a distance between the aperture member 168 and the substrate 101 may control the density distribution of active species near the substrate 101. At the upper processing position, the distance 302 may be at least about 1.5 inches, such as between about 1.6 inches and about 2.2 inches, for example about 2.1 inches.

Figure 3C:
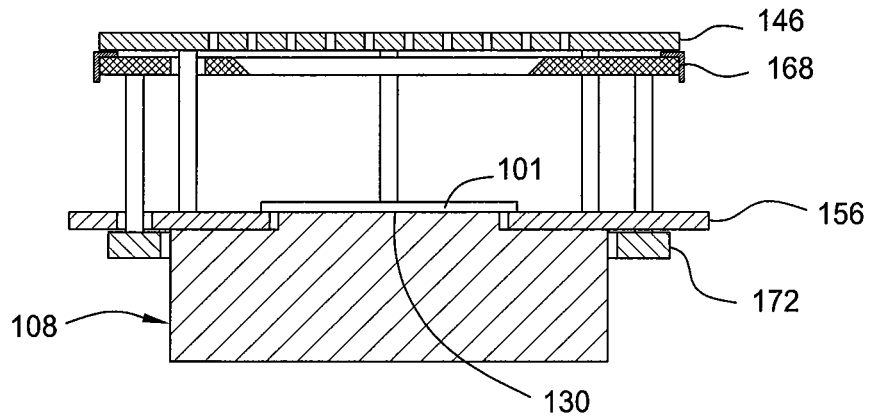

FIG. 3C is a sectional side view showing the aperture member 168 in a transferring position so that the substrate 101 can be transferred to and from the supporting assembly 108. The lift ring 172 and the aperture member 168 are raised to create space between the aperture member 168 and the raised portion 130 for substrate transferring.

Additionally, the distance between the aperture member 168 and the raised portion 130 may be dynamically adjusted during processing or between processing of successive substrates to achieve optimal reactive species uniformity for each substrate. When the distance between the aperture member 168 and the raised portion 130 is maximized, the difference between center etch rate and peripheral etch rate will be maximized, and when the distance is minimized, the etch rate difference will be minimized. This feature may be used to compensate for pattern effects on etch rate uniformity.

Figure 4A:
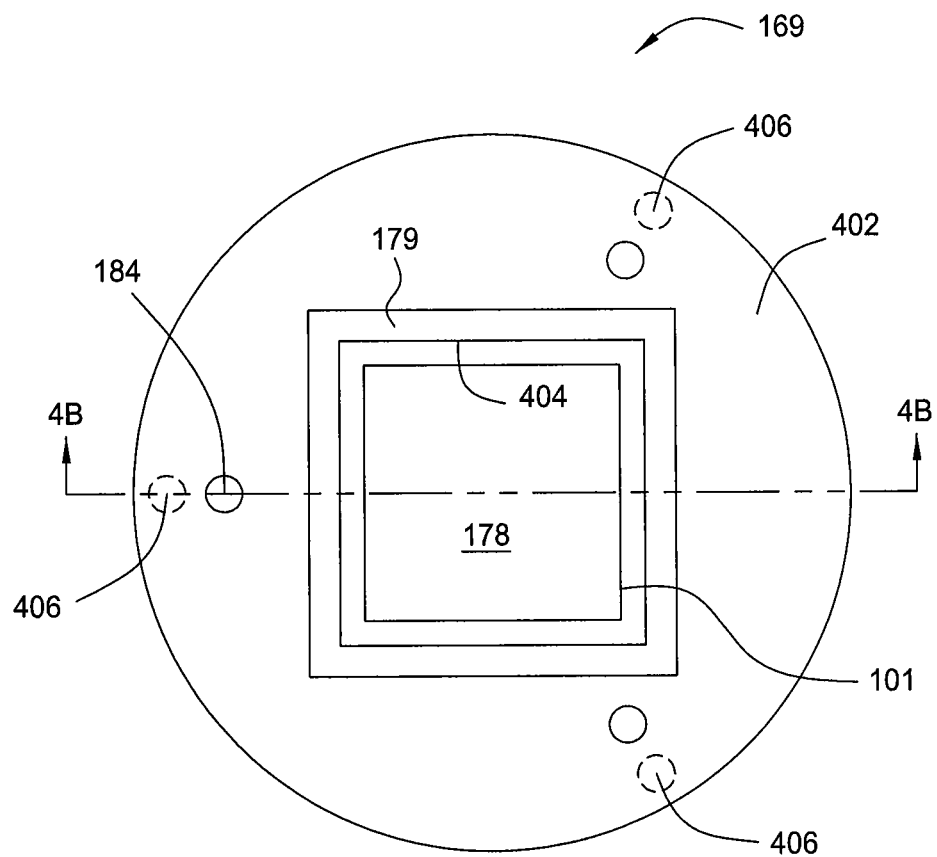
FIG. 4A is a top view of an aperture member according to one embodiment.
Figure 4B:
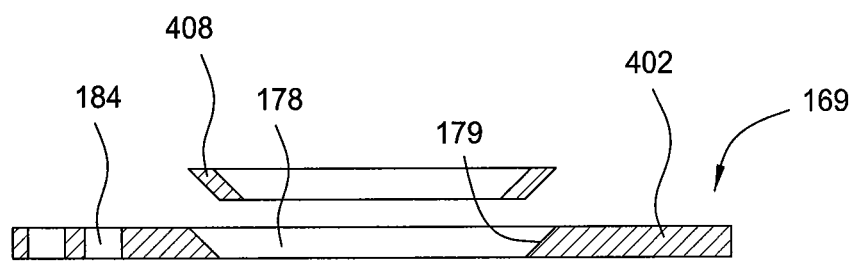
FIG. 4B is a sectional side view of an aperture member according to another embodiment.

FIG. 4A is a top view of the aperture member 168. FIG. 4B is a sectional side view of the aperture member 168. The aperture member 168 has a planar disk shaped body 402. The planar disk shaped body 402 may be circular for using in a processing chamber having cylindrical sidewalls. The aperture 178 is formed through a central area of the planar disk shaped body 402. The aperture 178 may be squared for processing a squared substrate 101. The aperture is generally shaped to follow the shape of substrates to be processed in the plasma chamber. The aperture 178 is defined by inner walls 404, which in the embodiments described herein are beveled, but may be substantially vertical in other embodiments. In one embodiment, the size of the aperture 178 may be slightly larger than the size of the substrate 101, such that the substrate 101 is visible through the aperture 178 in FIG. 4A. For example, the aperture 178 may be slightly greater than 6×6 inches in size. During processing, the aperture 178 is configured to be coaxially aligned with the substrate 101 to provide uniform processing of the substrate 101. It should be noted that the aperture 178 may be offset from a central axis of the substrate 101, if desired, to achieve a density profile that is not symmetric about a center of the substrate 101.

In one embodiment, three or more through holes 184 are formed along the periphery of the planar disk shaped body 402. The through holes 184 are configured to accommodate shield supports 150 for the ion-radical shield 142. Supporting features, such as lift supports 170, may be attached to the planar disk shaped body 402 at locations 406. Alternately, the locations 406 may be recesses adapted to receive support members such as the lift supports 170. The locations 406 may be positioned close to the through holes 184 so that the substrate 101 may be transferred through the space between neighboring lift supports 170.

It should be noted that the aperture member 168 and the aperture 178 may have different shapes depending on the shape of the chamber and the shape of the substrate respectively.

Referring to FIG. 4B, one or more ring-shaped inserts 408 may be used with the aperture member 168. The insert 408 has an outer dimension slightly larger than the dimension of the aperture 178 and an outer edge contoured to match the contoured wall 179 of the aperture 178 such that the insert 408 cannot pass through the aperture 178 when the insert 408 and the aperture member 168 are in a parallel mating orientation. The insert 408 rests on the contoured edge 179 of the aperture 178, reducing the size of the aperture 178 and potentially changing the shape and/or the central axis location of the aperture 178.

Various inserts 408 may have apertures of different size, and multiple inserts 408 may be used, if desired, to vary the aperture size, shape, and/or central axis location. For example, a first insert may have a first aperture that is between about ⅛" and about ¼" smaller in dimension that the aperture 178 of the aperture member 168. A second insert may have a second aperture that is between about ⅛" and about ¼" smaller than the first aperture, and may nest within the first aperture. Up to about five inserts may be nested within the aperture 168 of the aperture member 178 to reduce the aperture size by up to about 3", if desired. Varying the open area of the aperture using one or more inserts adds a method of control that may be used to adjust performance of the aperture member 168 for different substrates and chambers without having to take the chamber out of service to change major chamber components.

Figure 5:
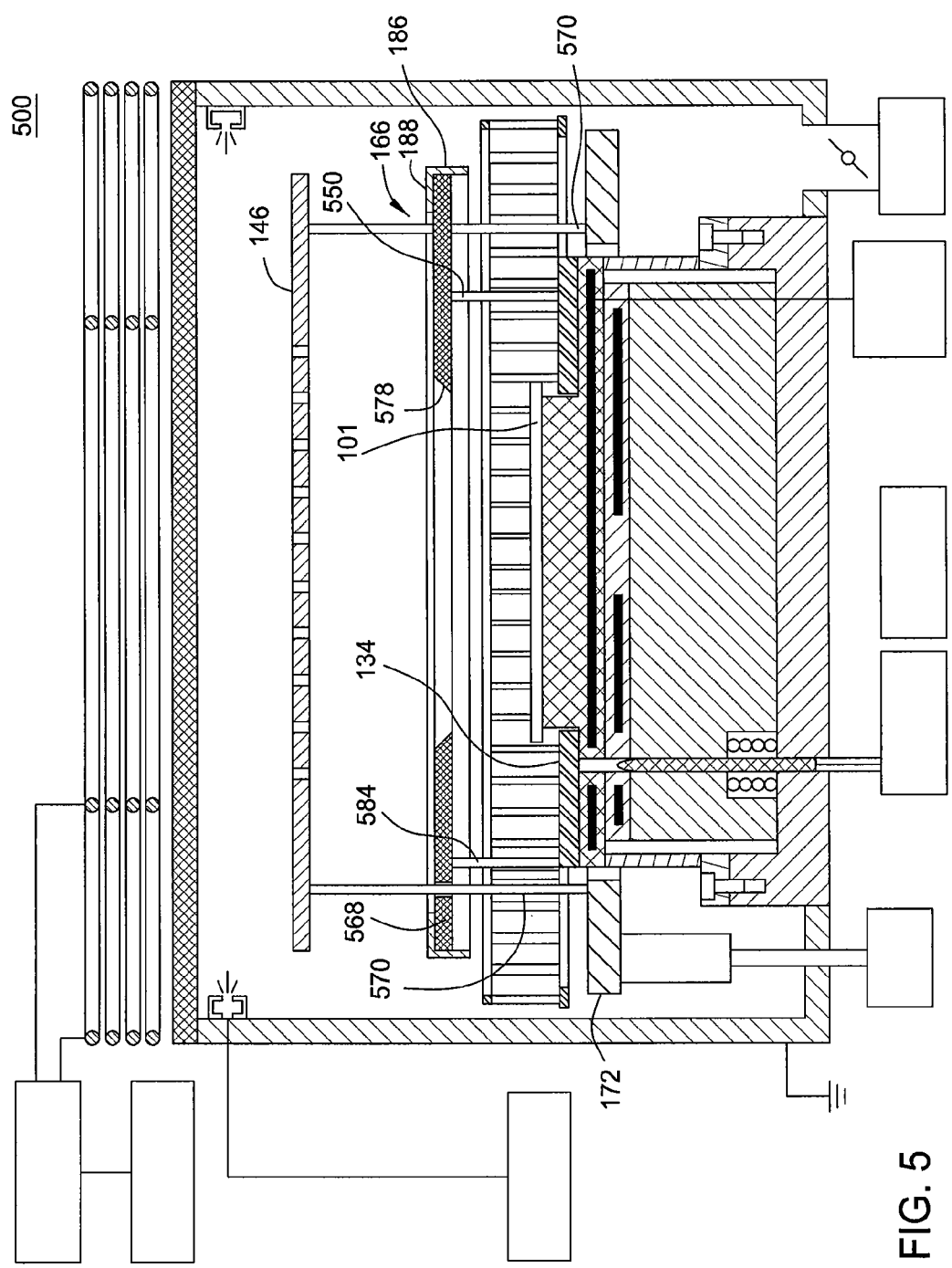
FIG. 5 is a sectional side view of a processing chamber according to another embodiment.

FIG. 5 is a schematic sectional side view of a processing chamber 500 according to another embodiment. The embodiment of FIG. 5 is generally similar to the embodiment of FIG. 1, but the aperture member 568 of FIG. 5 has an aperture 578 that is smaller than the substrate 101, and the lift supports 170 and shield supports 184 of FIG. 1 are swapped in FIG. 5 for lift supports 570 and aperture support 584. The lift supports 570 couple the ion-radical shield 146 to the lift ring 172, while the aperture supports 584 support the aperture member 568 from the adaptor 134. In the embodiment of FIG. 5, the ion-radical shield 146 may be moved closer to or further from the substrate 101, while the aperture member 568 remains stationary with respect to the substrate 101.

The embodiment of FIG. 5 incorporates another method of controlling the distribution of reactive species across the surface of the substrate 101. As the ion-radical shield 142 is moved with respect to the aperture member 568, the density profile of reactive species passing through the aperture 578 changes, resulting in a changing density profile at the substrate 101. It should be noted that embodiments are contemplated in which both the aperture member 568 and the ion-radical shield 146 are actuated.

While the foregoing is directed to embodiments of the invention, other and further embodiments of the invention may be devised without departing from the basic scope thereof.

What is claimed is:
1. An ion etch chamber, comprising:
a chamber body enclosing a processing region;
a substrate support disposed in the processing region and having a substrate receiving surface;
a plasma source disposed at a wall of the chamber body facing the substrate receiving surface;
an ion-radical shield disposed between the plasma source and the substrate receiving surface; and
a movable aperture member between the ion-radical shield and the substrate receiving surface, wherein the aperture member comprises an aperture plate having an aperture larger than the substrate receiving surface.

2. The ion etch chamber of claim 1, wherein the aperture member comprises an aperture plate and an edge shield extending toward the substrate receiving surface.

3. The ion etch chamber of claim 2, wherein the aperture plate has an aperture larger than the substrate receiving surface.

4. The ion etch chamber of claim 2, wherein the aperture member is coupled to a linear actuator operable to vary a distance between the aperture member and the substrate receiving surface.

5. The ion etch chamber of claim 2, wherein the aperture plate comprises quartz or ceramic.

6. The ion etch chamber of claim 1, wherein the aperture member is coupled to a linear actuator operable to vary a distance between the aperture member and the substrate receiving surface.

7. The ion etch chamber of claim 1, wherein the ion-radical shield is supported by a plurality of shield supports disposed through the aperture member.

8. The ion etch chamber of claim 7, wherein the aperture member is coupled to a linear actuator operable to vary a distance between the aperture member and the substrate receiving surface.

9. The ion etch chamber of claim 8, wherein a lift assembly is disposed between the aperture member and the linear actuator.

10. The ion etch chamber of claim 9, wherein the lift assembly comprises a lift ring and a plurality of lift supports on which the aperture member rests.

11. The ion etch chamber of claim 10, wherein the shield supports extend from a shield support ring disposed between the aperture member and the lift ring.

12. The ion etch chamber of claim 11, wherein the lift supports extend through the shield support ring.

13. A chamber for plasma processing of semiconductor substrates, comprising:
a substrate support;
a plasma source opposite the substrate support;
an ion filter disposed between the plasma source and the substrate support;
a focus plate disposed between the ion filter and the substrate support, the focus plate coupled to a linear actuator, wherein the focus plate comprises a central aperture and a baffle extending from an edge portion of the focus plate toward the substrate support, and wherein the central aperture has a larger area than a substrate receiving surface of the substrate support; and
an actuator operable to control elevation of the focus plate.

14. The chamber of claim 13, wherein the focus plate is coupled to the linear actuator by a support ring and a plurality of supports extending from the support ring.

15. The chamber of claim 14, wherein the actuator has a stroke length sufficient to move the focus plate from a first position proximate the ion filter to a second position proximate the substrate support, wherein the baffle extends beyond the substrate receiving surface when the focus plate is in the second position.

16. A plasma etch apparatus, comprising:
a chamber;
a plasma source disposed at one side of the chamber;
a substrate support disposed opposite the plasma source, with a stage facing the plasma source;
an ion-radical shield disposed between the plasma source and the substrate support, the ion-radical shield having a plurality of apertures formed in a region of the ion-radical shield aligned with the stage, the region of the ion-radical shield through which the apertures are formed having areal extent larger than the stage; and
an aperture plate disposed between the ion-radical shield and the substrate support, the aperture plate having a central aperture substantially the same size as the region of the ion-radical shield through which apertures are formed, wherein the aperture plate is coupled to a linear actuator by a lift ring and a plurality of lift supports extending from the lift ring and contacting the aperture plate.

* * * * *